(12) United States Patent
Forcht et al.

(10) Patent No.: US 11,256,182 B2
(45) Date of Patent: Feb. 22, 2022

(54) PROCESS FOR CLEANING OPTICAL ELEMENTS FOR THE ULTRAVIOLET WAVELENGTH RANGE

(71) Applicant: Carl Zeiss SMT GmbH, Oberkochen (DE)

(72) Inventors: Konstantin Forcht, Aalen (DE); Olaf Rogalsky, Ulm (DE); Irene Ament, Aalen (DE)

(73) Assignee: CARL ZEISS SMT GMBH, Oberkochen (DE)

(*) Notice: Subject to any disclaimer, the term of this patent is extended or adjusted under 35 U.S.C. 154(b) by 94 days.

(21) Appl. No.: 16/665,615

(22) Filed: Oct. 28, 2019

(65) Prior Publication Data

US 2020/0064748 A1 Feb. 27, 2020

Related U.S. Application Data

(63) Continuation of application No. PCT/EP2018/058979, filed on Apr. 9, 2018.

(30) Foreign Application Priority Data

Apr. 26, 2017 (DE) .......................... 102017207030.7

(51) Int. Cl.
*G03F 7/20* (2006.01)
*G02B 5/08* (2006.01)
*G02B 27/00* (2006.01)

(52) U.S. Cl.
CPC ....... *G03F 7/70925* (2013.01); *G02B 5/0891* (2013.01); *G02B 27/0006* (2013.01); *G03F 7/70933* (2013.01)

(58) Field of Classification Search
CPC .............. G02B 27/0006; G02B 5/0891; G03F 7/70925; G03F 7/70933; B08B 5/00;
(Continued)

(56) References Cited

U.S. PATENT DOCUMENTS 5,850,309 A 12/1998 Shirai et al.
6,231,930 B1 5/2001 Klebanoff
(Continued)

FOREIGN PATENT DOCUMENTS

DE 10138284 A1 2/2003
DE 10321103 A1 12/2004
(Continued)

OTHER PUBLICATIONS

German Office Action with English Translation, File Reference 10 2017 207 030.7, dated Jan. 1, 2017, 16 pages.
(Continued)

*Primary Examiner* — Deoram Persaud
(74) *Attorney, Agent, or Firm* — Edell, Shapiro & Finnan LLC (57) ABSTRACT

Proposed for cleaning optical elements for the ultraviolet wavelength range having at least one metal-containing layer on a surface is a process that includes: —supplying activated hydrogen to the surface having the metal-containing layer; subsequently supplying inert gas having an H2O volume fraction of below 5 ppm, preferably below 1 ppm, particularly preferably below 0.2 ppm. To this end, an optical system (1) includes a housing (122), a supply line (161) of activated hydrogen, a supply line (162) of inert gas having an $H_2O$ volume fraction of below 5 ppm and a discharge line (163) for pumping gas out of the housing.

16 Claims, 4 Drawing Sheets

(58) Field of Classification Search
CPC .......... B08B 7/0057; B21D 53/88; B60J 5/04; B60R 21/00
See application file for complete search history.

(56) References Cited

U.S. PATENT DOCUMENTS

| | | | |
|---|---|---|---|
| 7,361,233 B2 | 4/2008 | Budinger et al. | |
| 2003/0095623 A1 | 5/2003 | Singer et al. | |
| 2006/0175558 A1 | 8/2006 | Bakker et al. | |
| 2007/0018119 A1* | 1/2007 | Yabuta | H05G 2/003 250/493.1 |
| 2007/0054497 A1 | 3/2007 | Weiss et al. | |
| 2007/0125964 A1 | 6/2007 | Van Herpen et al. | |
| 2009/0038636 A1* | 2/2009 | Wuister | B08B 7/00 134/1 |
| 2009/0231707 A1 | 9/2009 | Ehm et al. | |
| 2009/0309045 A1 | 12/2009 | Metzmacher | |
| 2011/1088011 | 8/2011 | Ehm et al. | |
| 2013/0148200 A1 | 6/2013 | Ehm et al. | |
| 2013/0186430 A1 | 7/2013 | Ehm et al. | |
| 2013/0217154 A1 | 8/2013 | Fakazawa et al. | |
| 2014/0261568 A1* | 9/2014 | Delgado | G03F 7/70925 134/30 |
| 2015/0054188 A1* | 2/2015 | Ota | B29C 33/72 264/39 |
| 2015/0323862 A1* | 11/2015 | Chang | G03F 1/82 134/1.1 |
| 2017/0060005 A1* | 3/2017 | Chang | G03F 7/70925 |
| 2021/0109452 A1* | 4/2021 | Ma | G03F 7/70916 |

FOREIGN PATENT DOCUMENTS

| | | |
|---|---|---|
| DE | 102009001488 A1 | 11/2009 |
| DE | 102009045170 A1 | 4/2011 |
| DE | 102015219939 A1 | 10/2016 |
| EP | 1349009 A2 | 10/2003 |
| JP | 2011524643 A | 9/2011 |
| KR | 1020080075899 A | 8/2008 |
| KR | 1020090057368 A | 6/2009 |

OTHER PUBLICATIONS

PCT International Preliminary Report on Patentability, PCT/EP2018/058979, dated Oct. 29, 2019, 5 pages.
German Patent and Trademark Office, File reference 10 2017 207 030.7, Jan. 12, 2017, 4 pages.
International Search Report, PCT/EP2018/058979, dated Jun. 29, 2018, 4 pages.
KIPO Notice of Preliminary Rejection with English translation, KR Application No. 10-2019-7034345, (dated 2021), 12 pages.
KIPO Office Action with English translation, Application No. 10-2019-7034345, dated Sep. 30, 2021, 11 pages.

* cited by examiner

PROCESS FOR CLEANING OPTICAL ELEMENTS FOR THE ULTRAVIOLET WAVELENGTH RANGE

CROSS REFERENCE TO RELATED APPLICATIONS

This is a Continuation of International Application PCT/EP2018/058979, which has an international filing date of Apr. 9, 2018, and which claims the priority of German Patent Application 10 2017 207 030.7, filed Apr. 26, 2017. The disclosures of both applications are incorporated in their respective entireties into the present Continuation by reference.

FIELD OF THE INVENTION

The present invention relates to a process for cleaning optical elements for the ultraviolet wavelength range having at least one metal-containing layer on a surface. Furthermore, the invention relates to an optical system comprising an optical element for the ultraviolet wavelength range having at least one metal-containing layer on a surface. The present application claims the priority of German Patent Application 10 2017 207 030.7 of Apr. 26, 2017, the disclosure of which is hereby incorporated in to the present application in its entirety.

BACKGROUND

In particular, in the relatively short-wave ultraviolet wavelength range up to 120 nm, also called vacuum ultraviolet radiation (VUV radiation), it is not possible just to employ transmissive optical elements, rather it is often necessary also to have recourse to reflective optical elements. Optical elements comprising, on a substrate, a metallic layer and overlying that a protective layer or a highly reflective layer system have proven to be particularly worthwhile in this case. The protective layer or the layer system can comprise one or more fluorides. Such optical elements are known for example from U.S. Pat. No. 5,850,309.

The protective layer and the layer system, respectively, have the function, inter alia, of protecting the metallic layer against contamination, in particular as a result of oxidation. However, it has been observed that even low oxygen or water concentrations in the parts per million range can result in a degradation of the coating on the metallic layer and subsequently of the metallic layer as well. DE 10 2009 001 488 A1 discloses, for optical elements for the extreme ultraviolet wavelength range, approximately 1 nm to 20 nm, cleaning their surface with activated hydrogen and simultaneously providing a monomer, in particular of a hydrocarbon, which polymerizes under the influence of the activated hydrogen at the surface of the optical element to be cleaned and thereby forms a protective layer having low adsorption for metal hydrides which may form during the cleaning and in particular during operation with plasma radiation sources.

SUMMARY

It is an object of the present invention to propose a cleaning process for optical elements for the ultraviolet wavelength range, in particular up to 120 nm.

This object is achieved, according to one formulation, through a process for cleaning optical elements for the ultraviolet wavelength range having at least one metal-containing layer on a surface, comprising:

supplying activated hydrogen to the surface having a metal-containing layer;

subsequently supplying inert gas with an $H_2O$ volume fraction of less than 5 ppm.

Supplying activated hydrogen, i.e. hydrogen radicals or ionized hydrogen, results in contaminations being cleaned from the surface of the optical element. In particular, the oxidation of the metal-containing layer can be reversed. In order in this case to reduce the risk of renewed oxidation of the cleaned surface as a result of a concentration of water, oxygen, hydroxide ions or hydroxyl radicals, which is potentially increased as a result of the treatment with activated hydrogen, the atmosphere in the region of the surface of the optical element having a metal-containing layer is replaced by dry inert gas, namely inert gas having an $H_2O$ volume fraction of less than 5 ppm, preferably less than 1 ppm, particularly preferably less than 0.2 ppm. The proposed process is particularly well suited to optical elements having a metallic layer, in particular without an additional protective coating or with one which has already been damaged during operation of the optical element such that the metallic layer is no longer completely covered or through which a finite proportion of oxygen can diffuse.

Advantageously, the activated hydrogen is supplied by molecular hydrogen being added to inert gas with a proportion of 1-20 vol. % and this mixture being guided past a heating wire arrangement or being exposed to dissociating radiation. By way of the action of heat or the dissociating radiation, the molecular hydrogen can be split into hydrogen radicals or else ionized. The activated hydrogen has higher reaction rates than molecular hydrogen, with the result that better cleaning rates can also be achieved with activated hydrogen.

Preferably, the inert gas with an $H_2O$ volume fraction of less than 5 ppm, preferably less than 1 ppm, particularly preferably less than 0.2 ppm, is supplied for between 1 min and 100 min in order to sufficiently exchange and dry the atmosphere in the region of the optical element to be cleaned.

Advantageously, the activated hydrogen is supplied for between 1 min and 100 min in order to sufficiently remove contaminations present such as, for instance, hydrocarbon-containing deposits or oxidation of the surface, in particular of the metal-containing layer.

In preferred embodiments, the optical element is heated. This can be done while supplying activated hydrogen, while supplying dry inert gas or during both. During the process of supplying activated hydrogen, the heat input makes it possible to accelerate the reduction of the contamination through hydrogen on the surface of the optical element. During the process of supplying dry inert gas, the heat input makes it possible to accelerate the drying of the surface of the optical element.

Preferably, the optical element is heated to a temperature of up to 120° C., particularly preferably up to 100° C. In this regard, the cleaning can be accelerated without the optical element being adversely affected by excessively high heat input. If the cleaning takes place during ongoing operation, the optical element is preferably heated to approximately 40° C. to 50° C.

In order to support the drying process, advantageously, a cold trap and/or a drying agent and/or an area comprising a platinum metal are/is arranged in the vicinity of the surface having a metal-containing layer. It is thereby possible to further reduce the water and oxygen concentration in the inert gas.

In preferred embodiments, the sequence of supplying activated hydrogen and supplying inert gas is repeated at least once. In this way, the cleaning can be made more gentle and/or faster, for example by adapting the duration of the individual operations. In this way, the cleaning can be carried out particularly well during ongoing operation since, as necessary, activated hydrogen can be supplied again and again and in between the probability of oxidation can be reduced by purging with the dry inert gas.

Particularly preferably, the water concentration and/or oxide concentration are/is measured at the surface having a metal-containing layer and one or a plurality of operations for cleaning the optical element is or are begun or ended depending on one or a plurality of defined threshold values. In this regard, for instance, it is possible to begin the supply of activated hydrogen in the event of an oxide concentration being exceeded and to switch to the supply of dry inert gas in the event of said oxide concentration being undershot. It is also possible for only the water concentration or both parameters to be monitored and used for starting or ending the supply of activated hydrogen or dry inert gas.

Optionally, a concluding operation can involve adding inert gas having a fluorine or fluoride fraction or a hydrocarbon fraction. The hydrocarbon fraction can result in the formation of a polymeric protective layer affording protection against oxidation of the surface of the optical element having a metal-containing layer. The fluorine or fluoride fraction can result in the formation of a fluoride protective layer on the surface for protection against oxidation.

Furthermore, the object is achieved with an optical system comprising an optical element for the ultraviolet wavelength range having at least one metal-containing layer on a surface in a housing and a supply device for supplying activated hydrogen into the housing, a supply device for supplying inert gas having an $H_2O$ volume fraction of less than 5 ppm, preferably less than 1 ppm, particularly preferably less than 0.2 ppm, into the housing, and a discharge device for pumping gas out of the housing. Such an optical system can be used for cleaning the optical element having at least one metal-containing layer on a surface as just described.

Advantageously, for supporting the reduction operation and/or the drying operation, said optical system comprises a heating device and/or a radiation source.

Preferably, for reducing further the water and oxygen content in the inert gas, a cold trap and/or a drying agent and/or an area comprising a platinum metal are/is arranged in the vicinity of the surface having a metal-containing layer.

In particularly preferred embodiments, said optical system comprises a measuring unit for measuring the water and/or oxide concentration at the surface having a metal-containing layer. The cleaning process explained above can be controlled depending on the measured water and/or oxide concentration.

BRIEF DESCRIPTION OF THE DRAWINGS

The present invention will be explained in greater detail with reference to preferred exemplary embodiments. In this respect.

DETAILED DESCRIPTION

Figure 1:
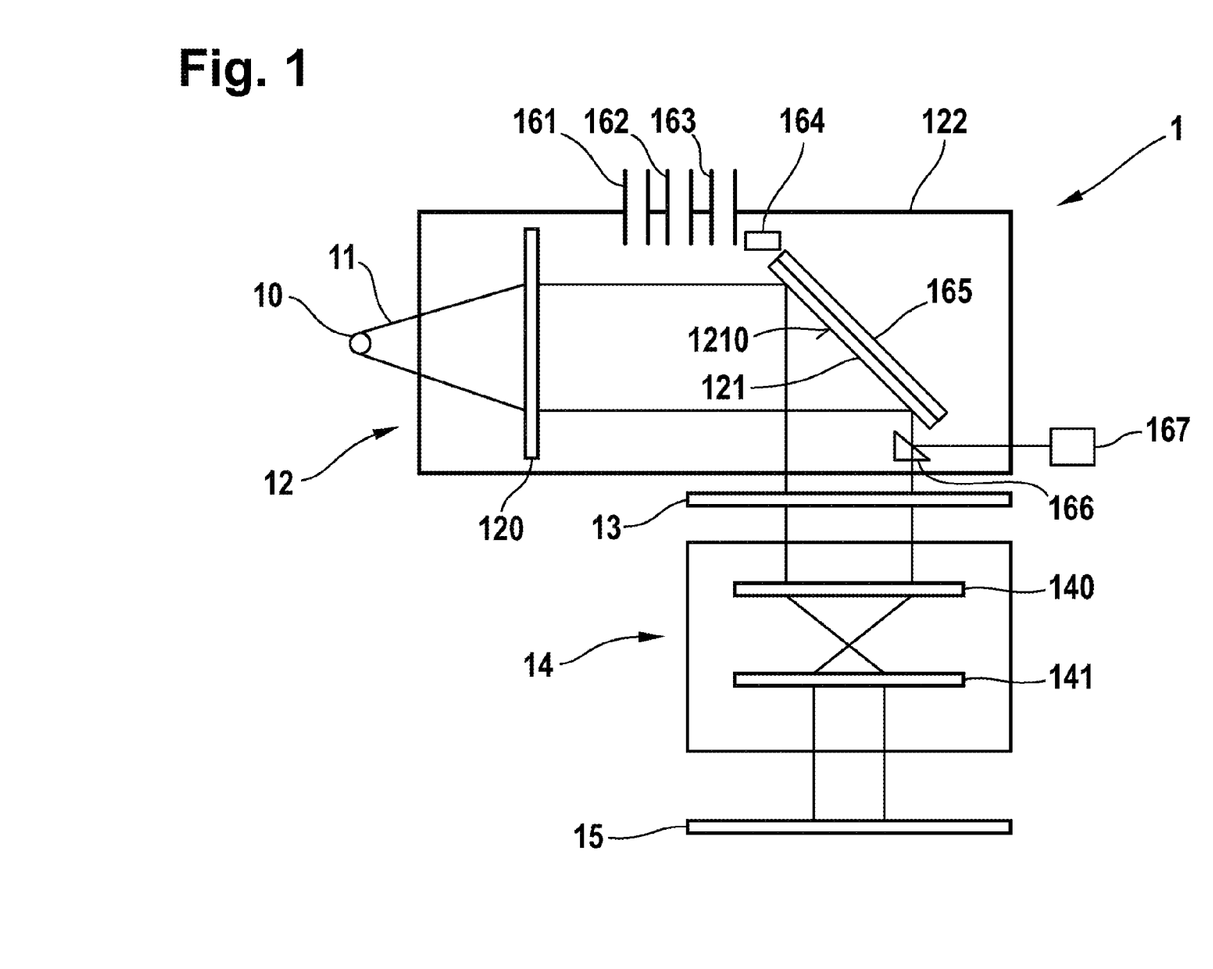
FIG. 1 shows a schematic illustration of an apparatus for UV lithography.

FIG. 1 shows a basic schematic diagram of an apparatus 1 for UV lithography. The UV lithography apparatus 1 comprises as essential constituent parts, in particular, two optical systems 12, 14, an illumination system 12 and a projection system 14. Carrying out lithography necessitates a radiation source 10, particularly preferably an excimer laser, which emits for example at 248 nm, 193 nm or 157 nm and which can be an integral part of the UV lithography apparatus. The radiation 11 emitted by the radiation source 10 is conditioned with the aid of the illumination system 12 such that a mask 13, also called reticle, can be illuminated thereby. In the example illustrated here, the illumination system 12 comprises transmissive and reflective optical elements. The transmissive optical element 120, which focuses the radiation 11, for example, and the reflective optical element 121, which deflects the radiation, for example, are illustrated here in representative fashion. In a known manner, in the illumination system 12, a wide variety of transmissive, reflective and other optical elements can be combined with one another in an arbitrary, even more complex, manner.

The mask 13 has a structure on its surface, said structure being transferred to an element 15 to be exposed, for example a wafer in the context of the production of semiconductor components, with the aid of the projection system 14. The projection system 14 comprises at least one transmissive optical element in the example illustrated here. In the example illustrated here, two transmissive optical elements 140, 141 are illustrated in representative fashion, which serve for example in particular to reduce the structures on the mask 13 to the size desired for the exposure of the wafer 15. In the projection system 14, too, inter alia reflective optical elements can be provided and a wide variety of optical elements can be combined with one another arbitrarily in a known manner. It should be pointed out that optical systems without transmissive optical elements can also be used.

The illumination system 12 will be discussed in greater detail by way of example below. The optical elements 120, 121 are arranged in a housing 122. The housing 122 has a feed line 161 for activated hydrogen, a feed line 162 for inert gas with an $H_2O$ volume fraction of less than 5 ppm, preferably less than 1 ppm, particularly preferably less than 0.2 ppm, and a discharge line 163 for pumping gas out of the housing 122. The feed lines 161, 162 can both be used together or be used individually also for purge gas used during the operation of the UV lithography apparatus. A separate feed line can also be provided for this purpose. Preferably, a mixture of nitrogen and one or more noble gases is used as inert gas, particularly if said cleaning takes place in situ and also during the operation of the optical element. Alternatively, one or more noble gases without nitrogen can also be used. Compared with pure nitrogen as inert gas, this has the advantage that less UV radiation is absorbed during operation.

The optical element 121 is a mirror having a surface 1210 having a metal reflective coating. In order to be able to be used with good reflectivity over a wide wavelength range, for example 100 nm to 200 nm, a metal layer composed of aluminum has proved worthwhile. Further suitable metals are noble metals and platinum metals, particularly for use with grazing incidence. The metal layer can be uncovered. It can have a protective layer composed of a dielectric layer. Metal fluorides, inter alia, are suitable as protective layer material. Magnesium fluoride, for example, has a particularly good transmission over the wide wavelength range mentioned. Furthermore, a layer system can also be provided on the metal layer in order to influence the optical properties of the optical element 121 in a targeted manner.

Figure 3:
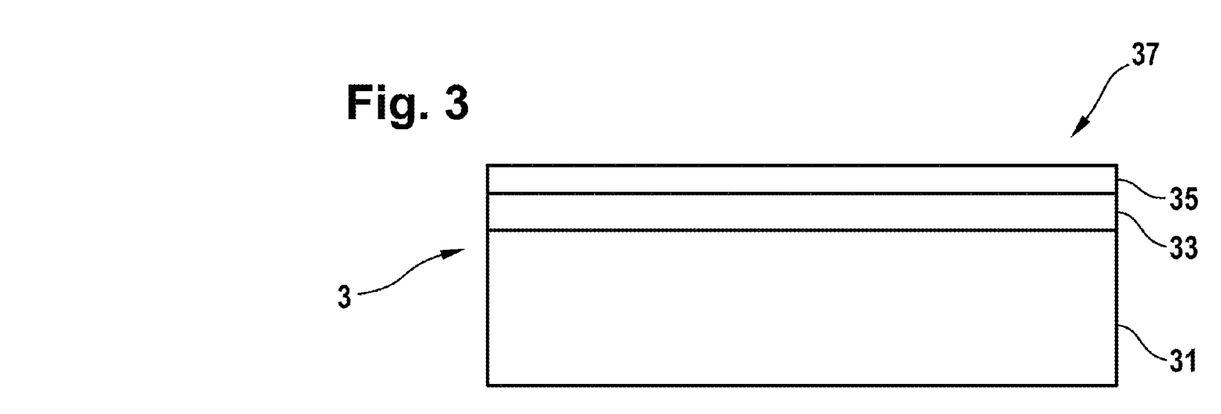
FIG. 3 shows a schematic illustration of a first optical element.
Figure 4:
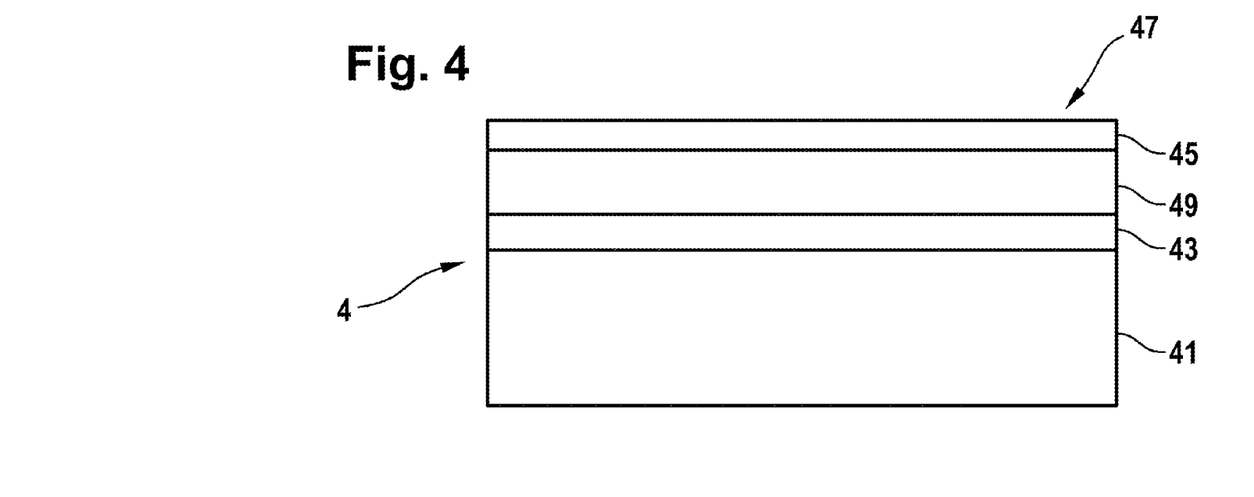
FIG. 4 shows a schematic illustration of a second optical element.

FIGS. 3 and 4 schematically illustrate possible exemplary embodiments of optical elements 3, 4 having a surface 37, 47 having a metal reflective coating 33, 43. The metal reflective coating 33, 43 is respectively applied on a substrate 31, 41. It can be applied directly on the substrate 31, 41, or an adhesion promoter layer and/or other functional layers can be provided between the metal reflective coating 33, 43 and the substrate 31, 41. In the embodiment variant illustrated in FIG. 3, a protective layer 35 is provided for protecting the metal reflective coating 33. The protective layer 35 can comprise more than one ply. In the embodiment variant illustrated in FIG. 4, for influencing the optical properties of the optical element 4, on the metal reflective coating 43 provision is additionally made of a layer system 49, preferably composed of dielectric materials, in particular composed of alternatively arranged layers having different refractive indices. In particular, the refractivity can thereby be increased in a targeted manner for specific wavelength regions. In the example illustrated in FIG. 4, the protective layer 45 is arranged on the layer system 49. It should be pointed out that in other variants, not illustrated, an optical element can have a metal fluoride layer rather than a metal reflective coating.

During the operation of optical systems comprising such optical elements, for example UV lithography apparatuses or wafer or mask inspection systems, the surface of the respective optical element can be contaminated, in particular as a result of oxidation by oxygen radicals or ions which are generated during operation under the influence of the UV radiation on oxygen or water situated in the purge gas or the gas atmosphere in the optical system. By way of example, metal fluoride layers, such as those composed of magnesium fluoride, for instance, can be damaged as a result of the oxidation and metal layers, composed of aluminum, inter alia, can incur a great loss of reflectivity as a result of oxidation. Metal oxides, in particular, can be reduced to metal again, however, with hydrogen. By way of example, aluminum oxide can be removed in this way such that an aluminum surface is available again. It should be pointed out that both oxygen and hydrogen radicals can diffuse through a protective layer composed for example of a metal fluoride, for instance composed of magnesium fluoride, and it can happen that at the same time for example a protective layer and an underlying metal layer can be oxidized and/or reduced.

For the purpose of cleaning the mirror 121, in the example illustrated in FIG. 1, firstly activated hydrogen is supplied to the mirror surface 1210. In the example illustrated here, this is accomplished by molecular hydrogen being introduced via the feed line 161 into the housing 122, where it is exposed to the radiation from the radiation source 10 for the purpose of dissociation. In variants, a dedicated radiation source can also be provided, the emission spectrum of which is specifically optimized for the dissociation of molecular hydrogen. In modifications, the molecular hydrogen, preferably before being introduced into the housing 122, in order to avoid additional contamination within the housing 122, can be guided past a heating wire arrangement. For this purpose, the cleaning is preferably carried out at reduced pressure or even under a vacuum, which can be made possible by way of the discharge line 163. In the case of cleaning at ambient pressure, it can be advantageous to provide a heating wire arrangement in the edge region of the mirror 121.

In order to support the dissociating effect of the radiation from the radiation source 10 and also the cleaning effect of the activated hydrogen, the mirror 121 is provided with a heating device 165. In the example illustrated in FIG. 1, the heating device is embodied in such a way that the mirror 121 is heated as homogeneously as possible over its entire surface 1210.

Via the feed line 162, after the addition of activated hydrogen, inert gas with an $H_2O$ volume fraction of less than 5 ppm, preferably less than 1 ppm, particularly preferably less than 0.2 ppm, is guided into the housing 122 and in particular onto the mirror surface in order to avoid new contamination of the cleaned surface 1210 having a metal-containing layer as a result of oxidation. In order to support this effect, the heating device 165 can be used for heating the mirror 121 during this stage of the method as well. Moreover, in the example illustrated in FIG. 1, a drying agent, for example comprising hygroscopic material, is provided in the vicinity of the mirror surface 1210. With the aid of these measures, the $H_2O$ volume fraction can be kept particularly low.

In the example illustrated in FIG. 1, the cleaning process including drying is monitored and controlled by radiation reflected from the mirror 121 being guided onto a detector 167 by a beam splitter 166 and being available for further evaluation, for example in a control device (not illustrated). In particular, in this way, it is possible to measure the water concentration and/or the oxide concentration on the mirror surface 1210 and to supply either more activated hydrogen or more dry inert gas depending on corresponding threshold values being exceeded or undershot. Such a procedure allows cleaning or sufficient suppression of the contamination not only in situ, but also during the lithography process. This measurement can also be used to switch from normal operation to cleaning operation. In variants, for the measurement of the water and/or oxide concentration, provision is made of a separate infrared radiation source for a particularly precise concentration determination.

In variants that are not illustrated, via one of the feed lines 161, 162 or a further feed line, it is possible to introduce inert gas with a fluorine or fluoride fraction or with a hydrocarbon fraction into the housing 122 after the cleaning process including drying has been concluded, and/or in order to create a protective gas atmosphere for an optical element having a metal-fluoride-containing surface. The hydrogen fraction, in particular in conjunction with UV radiation, for example, can polymerize to form a protective layer on the metal-containing mirror surface 1210. With a fluorine or fluoride fraction, a fluoride-containing protective layer can form on the metal-containing mirror surface 1210 as a result of reaction with the material at the mirror surface 1210. A fluoride-containing layer already present additionally has a lower probability of oxidizing if the atmosphere in the optical system also has fluorine compounds during operation.

Preferably, a fluoride compound, in particular a volatile fluoride compound, is added to the inert gas. The following are suitable, for example noble gas fluorides such as, inter alia, various xenon fluorides (e.g. xenon difluoride, xenon tetrafluoride) or krypton fluorides (e.g. krypton difluoride), noble metal fluorides such as, inter alia, platinum hexafluoride, fluorocarbons such as, inter alia, tetrafluoromethane, tetrafluoroethane, or else hydrofluoric acid. Under the influence of UV radiation, the fluorine compounds can dissociate to form fluorine radicals or fluoride ions. Metal-fluoride-containing protective layers, in particular, can be repaired by way of the fluorine radical or fluoride ion addition and the damage as a result of oxidation can thus be limited. In the case of metal layers, as a result of this addition, a metal fluoride layer can form which can serve as a protective layer, for example aluminum fluoride on aluminum. In the case where inert gas with an increased hydrocarbon fraction is added, inter alia the addition of methyl methacrylate has proved worthwhile, which polymerizes under UV irradiation to form polymethyl methacrylate and can likewise form a protective layer.

It should be pointed out that in connection with the example illustrated in FIG. 1, although only one optical element for the ultraviolet wavelength range having at least one metal-containing layer on a surface is discussed, two, three, four, five or more optical elements of this type can be provided in an optical system for UV lithography, for instance.

Optical elements as described above can also be used in wafer or mask inspection systems. One exemplary embodiment of a wafer inspection system 2 is illustrated schematically in FIG. 2. The explanations are likewise applicable to a mask inspection system.

Figure 2:
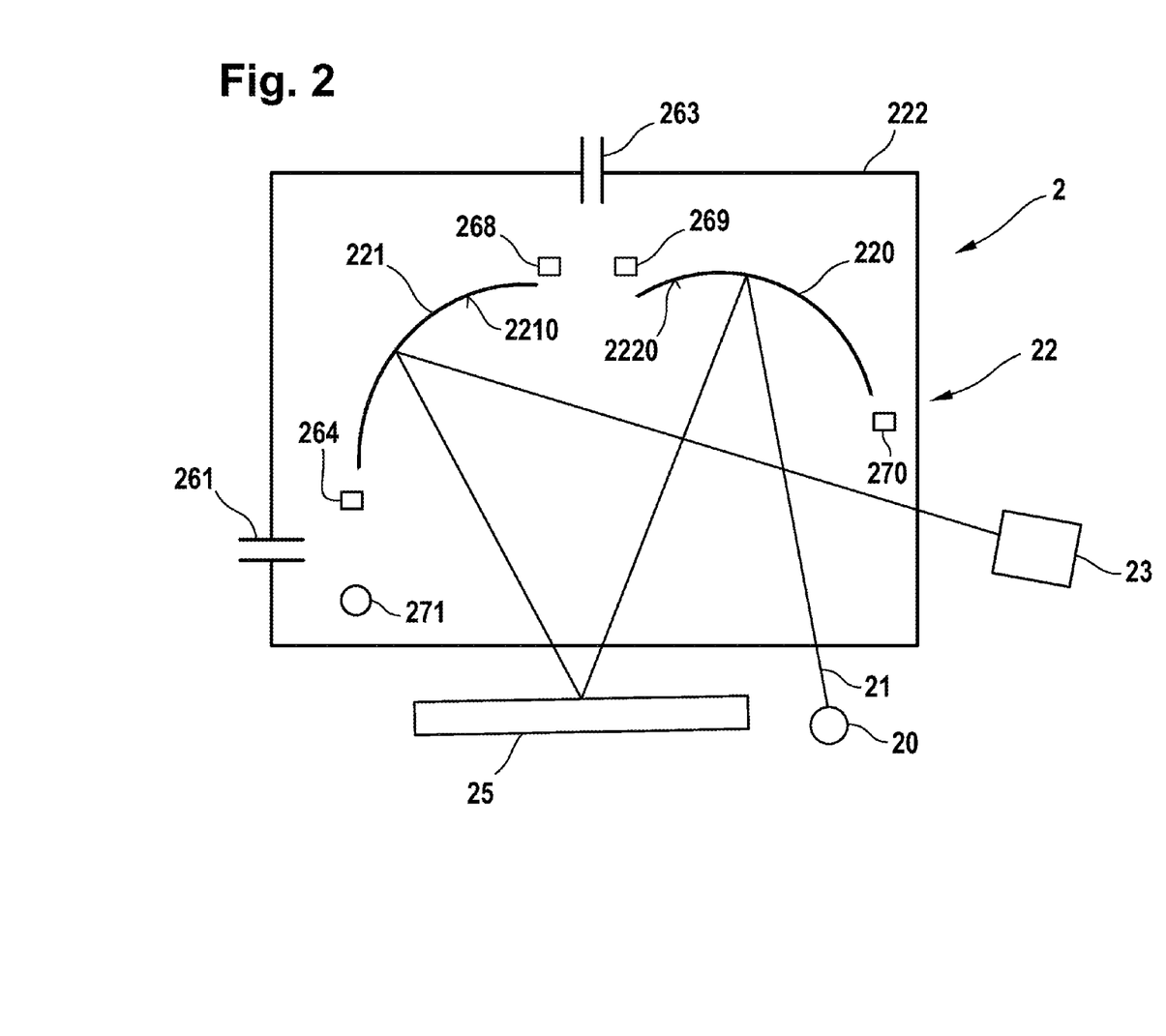
FIG. 2 shows a schematic illustration of a wafer inspection system.

The wafer inspection system 2 comprises a radiation source 20, the radiation of which is directed onto a wafer 25 by an optical system 222. For this purpose, the radiation is reflected from a concave mirror 220 of the optical system 22 onto the wafer 25. In the case of a mask inspection system, a mask to be examined could be arranged instead of the wafer 25. The radiation reflected, diffracted and/or refracted by the wafer 25 is directed onto a detector 23 for further evaluation by a concave mirror 221, which is likewise associated with the optical system 22. Both optical elements and optionally further optical elements (not illustrated) of the optical system 222 can be configured as above with reference to FIG. 3 or 4.

Besides the two mirrors 220, 221, the optical system 22 comprises a housing 222 with a feed line 261, which can be used both for supplying activated hydrogen and for supplying inert gas with an $H_2O$ volume fraction of less than 5 ppm, preferably less than 1 ppm, particularly preferably less than 0.2 ppm, and also a discharge line 263 for pumping gas out of the housing 222.

The radiation source 20 can be for example exactly one radiation source or a combination of a plurality of individual radiation sources in order to provide a substantially continuous radiation spectrum. The wavelength ranges of from approximately 120 nm to approximately 190 nm, from approximately 190 nm to approximately 210 nm or from approximately 190 nm to approximately 290 nm are particularly preferred. In modifications, one or more narrow-band radiation sources can also be used.

In the example illustrated in FIG. 2, a radiation source 271 is arranged in the region where the feed line 261 leads into the housing 222, the wavelength or wavelength range of said radiation source being less than or equal to 160 nm and resulting in a higher dissociation rate in the case of molecular hydrogen and preferably simultaneously in a lower dissociation rate in the case of molecular oxygen or water. Even if the hydrogen introduced by the feed line 261 has already been partly activated, for example by having been guided past a heating wire arrangement beforehand, the activation rate can be significantly increased by the dissociating radiation from the radiation source 271. The cleaning rate can thus likewise be increased. If the cleaning is not carried out during normal operation of the inspection system 2, but rather in a dedicated cleaning operating mode, the radiation source 20 is advantageously switched off.

In order to support the drying process when supplying inert gas with an $H_2O$ volume fraction of less 5 ppm, preferably less than 1 ppm, particularly less than 0.2 ppm, in the example illustrated in FIG. 2, a respective cold trap 268, 269 and a respective area 264, 270 comprising a platinum metal, in particular ruthenium, rhodium, palladium, osmium, iridium or platinum, are arranged at each mirror. It is thus possible additionally to reduce the water and oxygen content in the atmosphere in the housing and in particular in the vicinity of the surfaces 2210 and 2220 having a metal-containing layer of the mirrors 220 and 221. In this case, the platinum metal areas 264, 270 can act as a catalyst at which molecular oxygen is converted into water, which can be removed from the residual gas atmosphere in the housing 222 by the cold traps 268, 269. As an alternative to the cold traps 268, 269, it is also possible to use drying agents composed of porous material having good adhesion for water, such as zeolites, for instance. Furthermore, continuously gas is also pumped out of the housing 222 via the discharge line 263 and, if appropriate, water is thereby likewise removed.

In order to monitor the cleaning and drying progress, the radiation received by the detector 23 can be analyzed with spectroscopic methods, for example, also with regard to the water or oxide concentration at the surfaces 2210, 2220 having a metal-containing layer of the mirrors 220, 221, in particular of the second mirror 221 in the beam path. Depending on the measurement result, by way of example, it is possible to switch from wafer inspection operation to cleaning operation or to change over between supplying activated hydrogen and supplying dry inert gas, in particular in the case of cleaning during wafer inspection operation. In variants, the measurement can be carried out spectroscopically with a dedicated infrared radiation source.

Moreover, for the conclusion of the cleaning operation, via the feed line 261 or a further feed line, inert gas with a fluorine or fluoride fraction or with a hydrocarbon fraction can be introduced into the housing 222 after the cleaning process including drying has concluded. The hydrocarbon fraction, in particular in conjunction with UV radiation, for example, can polymerize to form a protective layer on the metal-containing mirror surfaces 2210, 2220. With a fluorine or fluoride fraction, a fluoride-containing protective layer can form on the metal-containing mirror surfaces 2210, 2220 as a result of reaction with the material at the mirror surfaces 2210, 2220.

Figure 5:
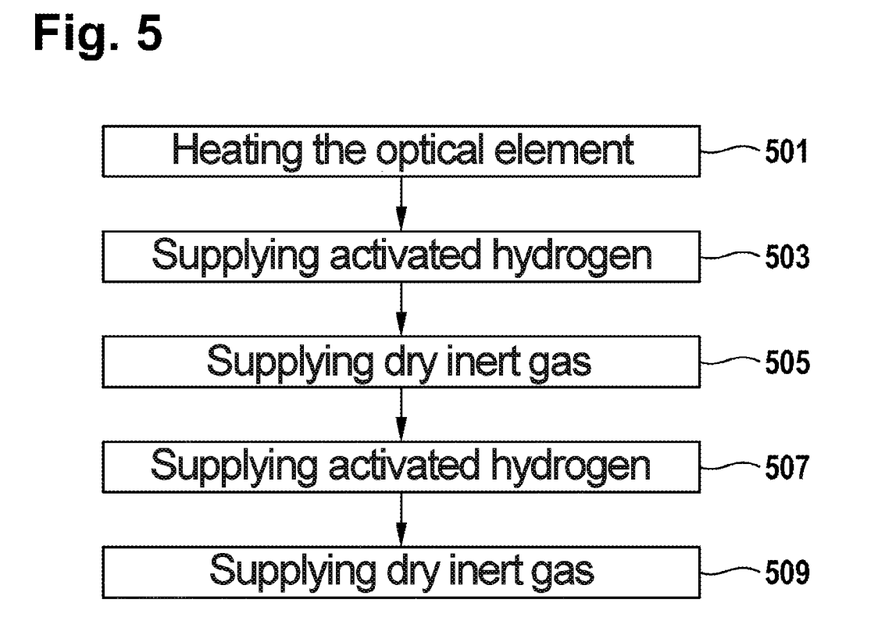
FIG. 5 shows a first variant of the cleaning process proposed.
Figure 6:
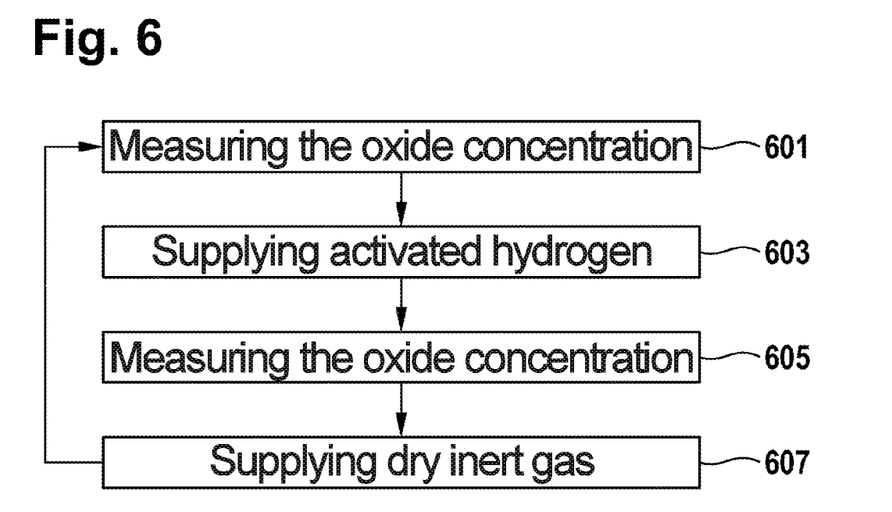
FIG. 6 shows a second variant of the cleaning process proposed.

Possible exemplary embodiments of the cleaning process proposed here will be illustrated further with reference to FIGS. 5 and 6.

In the exemplary embodiment in accordance with FIG. 5, a first operation 501 involves heating the optical element— to be cleaned—for the ultraviolet wavelength range having at least one metal-containing layer on a surface. Preferably, the optical element is heated to a temperature of up to 120° C., particularly preferably up to 100° C. In this regard, the cleaning can be accelerated, without the optical element being adversely affected by excessively high heat input. In variants, the cleaning can take place during ongoing operation of the optical element. In such cases, the optical element is preferably heated to approximately 40° C. to 50° C. Advantageously, the optical element is heated during the entire cleaning process.

In a further operation 503, activated hydrogen is supplied to the surface having a metal-containing layer in order to remove contamination, in particular contamination on the basis of oxidation. In the exemplary embodiment in accordance with FIG. 5, the activated hydrogen is supplied by molecular hydrogen being added to inert gas with a proportion of 1-20 vol % and this mixture being guided past a heating wire arrangement and being exposed to dissociating radiation, in order to achieve a particularly high activation rate, i.e. a particularly high proportion of ionized hydrogen and hydrogen radicals. Depending on the degree of contamination and degree of activation, the activated hydrogen is supplied for between 1 min and 100 min, preferably for between a few minutes and a few tens of minutes, in order sufficiently to remove contaminations present such as, for instance, hydrocarbon-containing deposits or oxidation of the surface, in particular of the metal-containing layer. Heating the optical element in accordance with operation 501 makes it possible easily to increase the degree of activation and also the reaction rate at which contamination is removed.

After this time period has elapsed, in a further operation 505, dry inert gas is supplied to the surface having a metal-containing layer in order to reduce the risk of renewed oxidation of the cleaned surface as a result of a concentration of water, oxygen, hydroxide ions or hydroxyl radicals that is possibly increased as a result of the treatment with activated hydrogen. The atmosphere in the region of the surface of the optical element having a metal-containing layer is thus replaced by particularly dry inert gas. In this case, in the present example, a mixture of nitrogen and one or more noble gases is used as inert gas, particularly if said cleaning takes place in situ and also during the operation of the optical element. Alternatively, one or more noble gases without nitrogen can also be used if the cleaning process is carried out during the operation of the optical element, in order to absorb less UV radiation. Moreover, the inert gas with an $H_2O$ volume fraction of less than 5 ppm, preferably less than 1 ppm, particularly preferably less than 0.2 ppm, depending on the proportion of water in the inert gas and the concentration of water, oxygen, hydroxide ions and/or hydroxyl radicals, is supplied for between 1 min and 100 min, preferably for between a few minutes and a few tens of minutes, in order sufficiently to exchange and dry the atmosphere in the region of the surface having a metal-containing layer of the optical element to be cleaned.

As already explained in association with the UV lithography apparatus from FIG. 1 or the wafer or mask inspection system from FIG. 2, a cold trap and/or a drying agent and/or an area comprising a platinum metal can be arranged in the vicinity of the surface having a metal-containing layer that is to be cleaned, in order to contribute to an atmosphere having particularly little water in the region of said surface. Heating the optical element in accordance with operation 501 is also beneficial to that.

In order to achieve a particularly good cleaning effect, the operations of supplying activated hydrogen and supplying dry inert gas are respectively repeated as operation 507 and operation 509. In variants, an adequate result can be achieved even without repeating this sequence of operation, or this sequence of operations can also be repeated more than once, that is to say two, three, four, five times or even more often.

The exemplary embodiment illustrated in FIG. 6 differs from the exemplary embodiment explained above in connection with FIG. 5 in particular to the effect that the oxide concentration is measured at the surface having a metal-containing layer and activated hydrogen or dry inert gas is added depending on one or, in further variants, a plurality of defined threshold values.

A first operation 601 involves measuring the oxide concentration at the surface having a metal-containing layer in order to ascertain whether a corresponding threshold value has been exceeded, i.e., above which the oxide contamination should be removed with activated hydrogen. As soon as this threshold value has been exceeded, the supply of activated hydrogen is switched on in an operation 603, as described above. For this purpose, the normal operation of the optical system comprising such an optical element can be interrupted or continued, depending on the optical system. A further operation 605 involves once again measuring the oxide concentration at the surface having a metal-containing layer in order to ascertain whether said oxide concentration has fallen below the threshold value again. As soon as this is the case, an operation 607 involves switching to supplying dry inert gas, as described above. Afterward, once again in accordance with operation 601 it is possible to measure the oxide concentration at the surface having a metal-containing layer in order to ascertain whether the threshold value has been exceeded, i.e., by reaching a value above which the oxide concentration should be removed with activated hydrogen. The process in accordance with this exemplary embodiment can be continued for as long as desired.

Alternatively or cumulatively, it is also possible to measure the water concentration at the surface having a metal-containing layer. Spectroscopic methods are preferably used. In variants, different threshold values can be employed and the supply of activated hydrogen and the supply of dry inert gas can also be carried out wholly or partly in parallel. This exemplary embodiment allows, in particular, the targeted cleaning even during operation of an optical system comprising such an optical element.

Moreover, in variants of the exemplary embodiments described, for the conclusion of the cleaning process, inert gas with a fluorine or fluoride fraction or with a hydrocarbon fraction can be supplied to the cleaned surface. The hydrocarbon fraction, in particular in conjunction with UV radiation, for example, can polymerize to form a protective layer on the surface having a metal-containing layer. With a fluorine or fluoride fraction, a fluoride-containing protective layer can form as a result of reaction with the surface material.

The proposed process is particularly well suited to optical elements having a metallic layer, in particular without an additional protective coating or with one which has already been damaged during operation of the optical element such that the metallic layer is no longer completely covered or through which a finite proportion of oxygen can diffuse. In particular, it is well suited to the cleaning of optical elements which are designed for wavelengths in the ranges of from approximately 120 nm to approximately 190 nm, or approximately 190 nm to approximately 210 nm or from approximately 190 nm to approximately 290 nm, such as can be used, inter alia, in wafer or mask inspection systems or in UV lithography apparatuses.

REFERENCE NUMERALS

1 UV lithography apparatus
2 Wafer inspection system
3 Optical element
4 Optical element
10 Radiation source 11 Radiation
12 Illumination system
13 Mask
14 Projection system
15 Element to be exposed
20 Radiation source
21 Radiation
22 Optical system
23 Detector
25 Wafer
31 Substrate
33 Metal reflective coating
35 Protective layer
37 Surface
41 Substrate
43 Metal reflective coating
45 Protective layer
47 Surface
49 Layer system
120 Lens element
121 Mirror
122 Housing
140 Lens element
141 Lens element
161 Feed line
162 Feed line
163 Discharge line
164 Drying agent
165 Heating device
166 Beam splitter
167 Detector
220 Mirror
221 Mirror
222 Housing
261 Feed line
263 Discharge line
264 Platinum part
268 Cold trap
269 Cold trap
270 Platinum part
271 Radiation source
501-509 Specified operations
601-607 Specified operations
1210 Mirror surface
2210 Mirror surface
2220 Mirror surface

What is claimed is:

1. A process for cleaning an optical element for the ultraviolet wavelength range that has at least one metal-containing layer on a surface of the optical element, comprising:
supplying a cleaning gas to the surface that has the metal-containing layer, the cleaning gas comprising a first fraction of activated hydrogen; and
subsequently supplying a drying gas to the surface, the drying gas comprising inert gas with an $H_2O$ volume fraction of less than 5 ppm and a second fraction of activated hydrogen,
wherein the first fraction of activated hydrogen is greater than the second fraction of activated hydrogen.

2. The process as claimed in claim 1, wherein supplying the cleaning gas comprises:
adding molecular hydrogen to inert gas with a proportion of 1-20 vol %, to produce a mixture, and
at least one of: guiding the mixture past a heating wire arrangement, and exposing the mixture to dissociating radiation.

3. The process as claimed in claim 1, wherein the inert gas with an $H_2O$ volume fraction of less than 5 ppm is supplied for between one minute and 100 minutes.

4. The process as claimed in claim 1, wherein the cleaning gas is supplied for between one minute and 100 minutes.

5. The process as claimed in claim 1, wherein said supplying of the cleaning gas and said supplying of the drying gas are repeated at least once.

6. The process as claimed in claim 1, further comprising heating the optical element.

7. The process as claimed in claim 6, wherein the optical element is heated to a temperature of up to 120° C.

8. The process as claimed in claim 1, further comprising:
measuring at least one of a water concentration and an oxide concentration are/is measured at the surface having a metal-containing layer; and
beginning or ending at least one cleaning process for the optical element in accordance with at least one defined threshold value.

9. The process as claimed in claim 1, further comprising:
arranging at least one of a cold trap, a drying agent and an area comprising a platinum metal in a vicinity of the surface having the metal-containing layer.

10. The process as claimed in claim 1, further comprising:
subsequently adding inert gas having a fluorine or fluoride fraction or a hydrocarbon fraction.

11. The process as claimed in claim 1, wherein the second fraction of activated hydrogen is substantially zero.

12. An optical system comprising an optical element configured for an ultraviolet wavelength range, comprising:
a housing for the optical element, wherein the optical element has at least one metal-containing layer on a surface of the optical element,
a supply device supplying a cleaning gas into the housing, the cleaning gas comprising a first fraction of activated hydrogen,
a supply device supplying a drying gas into the housing, the drying gas comprising inert gas having an $H_2O$ volume fraction of less than 5 ppm and a second fraction of activated hydrogen, and
a discharge device configured to pump at least some of the gas out of the housing,
wherein the first fraction of activated hydrogen is greater than the second fraction of activated hydrogen.

13. The optical system as claimed in claim 12, further comprising:
at least one of a heating device and a radiation source.

14. The optical system as claimed in claim 12, further comprising:
at least one of a cold trap, a drying agent and an area comprising a platinum metal arranged in a vicinity of the surface having the metal-containing layer.

15. The optical system as claimed in claim 12, further comprising:
a measuring unit measuring at least one of a water concentration and an oxide concentration at the surface that has the metal-containing layer.

16. The optical system as claimed in claim 12, wherein the second fraction of activated hydrogen is substantially zero.

* * * * *

UNITED STATES PATENT AND TRADEMARK OFFICE
CERTIFICATE OF CORRECTION

PATENT NO. : 11,256,182 B2
APPLICATION NO. : 16/665615
DATED : February 22, 2022
INVENTOR(S) : Konstantin Forcht et al.

It is certified that error appears in the above-identified patent and that said Letters Patent is hereby corrected as shown below:

On the Title Page

In Column 2, in item (57) "Abstract", Line 5, delete "H2O" and insert -- $H_2O$ --.

On Page 2, in Column 2, under "Other Publications", Line 1, delete "Reporton" and insert -- Report on --.

Signed and Sealed this
Twenty-eighth Day of March, 2023

Katherine Kelly Vidal
*Director of the United States Patent and Trademark Office*